United States Patent [19]

Murphy et al.

[11] Patent Number: 5,170,080
[45] Date of Patent: Dec. 8, 1992

[54] SUPERCONDUCTING PUSH-PULL FLUX QUANTUM DIGITAL LOGIC CIRCUITS

[75] Inventors: John H. Murphy, Churchill Boro; Michael R. Daniel, Monroeville; John X. Przybysz, Penn Hills, all of Pa.

[73] Assignee: Westinghouse Electric Corp., Pittsburgh, Pa.

[21] Appl. No.: 744,754

[22] Filed: Aug. 14, 1991

[51] Int. Cl.⁵ .......................................... H03K 19/195
[52] U.S. Cl. .................................... 307/476; 307/306; 307/462
[58] Field of Search ............... 307/306, 476, 462, 245, 307/277; 505/859, 861

[56] References Cited

U.S. PATENT DOCUMENTS

| | | | |
|---|---|---|---|
| 4,275,314 | 6/1981 | Fulton | 307/462 |
| 4,313,066 | 1/1982 | Gheewala | 307/306 X |
| 4,482,821 | 11/1984 | Houkawa et al. | 307/476 X |
| 4,538,077 | 8/1985 | Sone | 307/476 |
| 4,555,643 | 11/1985 | Kotera et al. | 307/476 |

FOREIGN PATENT DOCUMENTS

| | | | |
|---|---|---|---|
| 0095979 | 12/1983 | European Pat. Off. | 307/476 |
| 0058319 | 3/1986 | Japan | 307/465 |
| 0002416 | 1/1989 | Japan | 307/476 |

Primary Examiner—Eugene R. LaRoche
Assistant Examiner—Son Dinh
Attorney, Agent, or Firm—R. P. Lenart

[57] ABSTRACT

Superconducting digital logic circuits constructed in accordance with this invention include a circuit branch having first and second Josephson junctions electrically connected in series with each other, with a junction point between the first and second Josephson junctions connected to a neutral point; a positive bias voltage is connected to one end of the circuit branch, and a negative bias voltage is connected to a second end of the circuit branch; a first rail for applying a first input voltage signal, having a first polarity, and for extracting a first output signal is connected to one end of the circuit branch; and a second rail for applying a second input voltage signal, having a second polarity, and for extracting a second output signal is connected to the other end of the circuit branch. This invention encompasses both the above circuit and the method of signal processing performed by such circuits.

27 Claims, 3 Drawing Sheets

1

SUPERCONDUCTING PUSH-PULL FLUX QUANTUM DIGITAL LOGIC CIRCUITS

BACKGROUND OF THE INVENTION

This invention relates to superconducting circuits and, more particularly, to synchronous, digital superconducting logic circuits.

Josephson junctions have the ability to switch from the zero voltage state to a non-zero voltage state in times on the order of picoseconds, with the switching being limited by the resistive-capacitive time constant of the junction. Both hysteretic and non-hysteretic Josephson junctions have been used to construct high speed circuits having low power dissipation. There are two physical principles upon which data can be stored in Josephson logic systems. The first approach is to encode the stored data as a voltage across the Josephson junction. The second approach is to encode the stored data as magnetic flux trapped in a persistent superconducting loop. The smallest amount of magnetic flux for which the latter approach can be applied is a single flux quantum $\phi_o$.

There are two physical principles upon which data can be transferred throughout a Josephson logic system. The first approach is to encode the data to be transferred as an electric current. The second approach is to encode the data to be transferred as a voltage pulse, V. For single flux quanta, the area of the voltage pulses over a period of time that will allow logic functions to be performed within the superconducting loops is equal to $\phi_o$.

The logic representation used in superconducting circuits is vitally important to how the circuits perform signal inversion. In classical representation, where a logic TRUE is represented by a positive voltage and a logic FALSE is represented by a zero voltage, signal inversion must be accomplished by timed inversion. Since the superconducting phenomena does not support a three terminal transistor-like circuit, all state-of-the-art superconducting digital electronic circuits have only achieved signal inversion by signal interaction with an auxiliary timing signal. This timed inversion feature inherent in state-of-the-art superconducting digital electronic circuits limits their processing speed.

One type of superconducting digital logic circuit encodes a binary unity/zero as the presence/absence of a DC voltage across an unshunted Josephson tunnel junction. With a hysteretic current/voltage curve such "latching" circuits must be AC powered so that they can be reset to the initial superconducting state and this resetting must be slow enough to avoid punch through effects.

A second type of superconducting digital logic circuit uses the presence/absence of a single flux quanta in superconducting quantum interferometers to store the information. Such circuits are termed Resistive or Rapid Single Flux Quantum (RSFQ) circuits. General background information on RSFQ circuits can be found in an article by A. O. Mukhanov et al. entitled, "Ultimate Performance of the RSFQ Logic Circuits.", in IEEE Transactions on Magnetics, Vol. MAG-23, No. 2, March, 1987, and an article by K. K. Likharev and V. K. Semenov, entitled "RSFQ Logic/Memory Family: A New Josephson-Junction Technology for Sub-TeraHertz-Clock-Frequency Digital Systems", in IEEE Transactions on Applied Superconductivity, Vol. 1, No. 1, March, 1991.

RSFQ logic circuits are timed or clocked circuits, that is, they need two signals to define the information, a timing signal to define the interval for valid data and a data signal for defining the data being transmitted. This approach slows the speed at which data can be transmitted by a factor of 2. In addition, RSFQ circuits are asynchronous so they must trap and store intermediate calculations for future readout. This feature forces the inclusion of interferometers in each logic circuit. Interferometers, even for single magnetic flux quanta trapping, are spatially large circuits.

It is therefore desirable to devise a family of superconducting digital logic circuits which do not require an AC bias source, a separate timing signal, or the use of interferometers in each logic circuit. Commonly assigned applications entitled, "Superconducting Push-Pull Flux Quantum Logic Circuits" and "Superconducting Push-Pull Flux Quantum Gate Array Cells", filed concurrently herewith disclose such a family of superconducting digital logic circuits. The present invention provides additional push-pull superconducting flux quantum digital logic circuits.

SUMMARY OF THE INVENTION

This invention includes dual-rail single flux quantum digital logic circuits wherein the two rails operate with opposite polarity signals rather than the single polarity signals used in RSFQ circuits.

Superconducting digital logic circuits constructed in accordance with this invention include a circuit branch having first and second Josephson junctions electrically connected in series with each other, with a junction point between the first and second Josephson junctions connected to a neutral point; a positive bias voltage is connected to one end of the circuit branch, and a negative bias voltage is connected to a second end of the circuit branch; a first rail for applying a first input voltage signal, having a first polarity, and for extracting a first output signal is connected to the first end of the circuit branch; and a second rail for applying a second input voltage signal, having a second polarity, and for extracting a second output signal is connected to the second end of the circuit branch.

This invention encompasses both the above circuits and the methods of signal processing performed by such circuits. Since the invention does not depend on timing signals to distinguish logic TRUE from logic FALSE signals, the signals can be synchronized less frequently than signals in RSFQ circuits, thereby resulting in increased operating speed.

BRIEF DESCRIPTION OF THE DRAWINGS

The present invention will be more readily apparent to those skilled in the art when discussed in terms of the following circuits illustrative of the preferred embodiments thereof, wherein the various Figures are schematic diagrams of circuits constructed in accordance with the invention.

In particular.

DESCRIPTION OF THE PREFERRED EMBODIMENTS

Circuits constructed in accordance with this invention utilize push-pull flux quanta (PPFQ) logic circuits based on the representation of a logic one or TRUE state by a positive voltage pulse, V(t), which has an area given by:

$$\int V(t)dt = +\phi_O \quad (1)$$

and a logic O or FALSE state by a negative voltage pulse, V(t), which has an area given by:

$$\int V(t)dt = -\phi_O \quad (2)$$

where $\phi_O$ ($2.07 \times 10^{-15}$ Webers) is a single flux quantum. By representing both logic states by active voltage pulses, logic can be performed without needing superconducting interferometers to trap the state of computation, nor timing pulses to read and reset the state of the interferometers. PPFQ logic circuits are utilized in the present invention receive separate positive polarity data signals and negative polarity data signals, and produce modified versions of the positive and negative polarity data signals as output signals.

Figure 1:
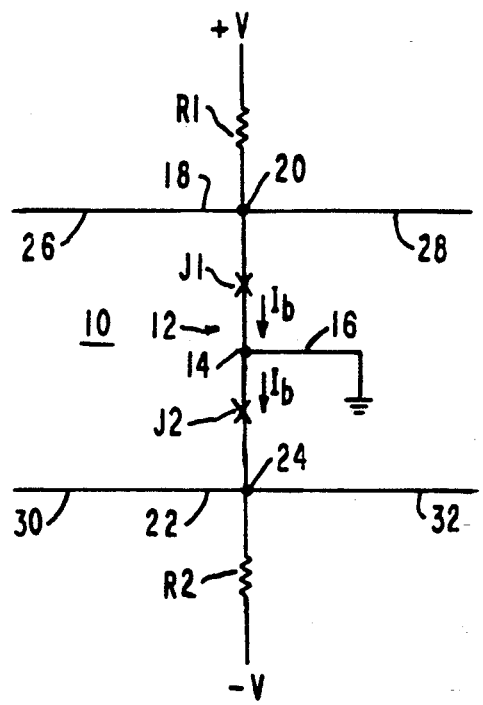
FIG. 1 is a basic polarized rail signal processing circuit.

FIG. 1 is a schematic diagram of the basic polarized rail signal processing circuit 10 constructed in accordance with this invention. A first circuit branch 12 comprising the series connection of Josephson junctions J1 and J2 is electrically connected between positive and negative voltage sources by way of resistors R1 and R2. A junction point 14 between junctions J1 and J2 is connected by way of conductor 16 to ground. The positive rail 18 is connected to a junction point 20 between resistor R1 and Josephson junction J1. The negative rail 22 is connected to a junction point 24 between resistor R21 and Josephson junction J2.

The bias current $I_b$ is set to about 75% of the Josephson junction critical currents $I_c$. When a positive voltage pulse is present on input line 26, this voltage pulse causes junction J1 to momentarily switch off. The switching off of junction J1 causes a voltage pulse to be present on output line 28. When a negative voltage pulse is present on input line 30, that voltage pulse causes junction J2 to momentarily switch off. This switching off of junction J2 causes a negative voltage pulse on output line 32. Finally, when no voltage pulses are present at the inputs, neither junctions J1 or J2 switch. Therefore, the result is a zero voltage on both outputs.

Figure 2:
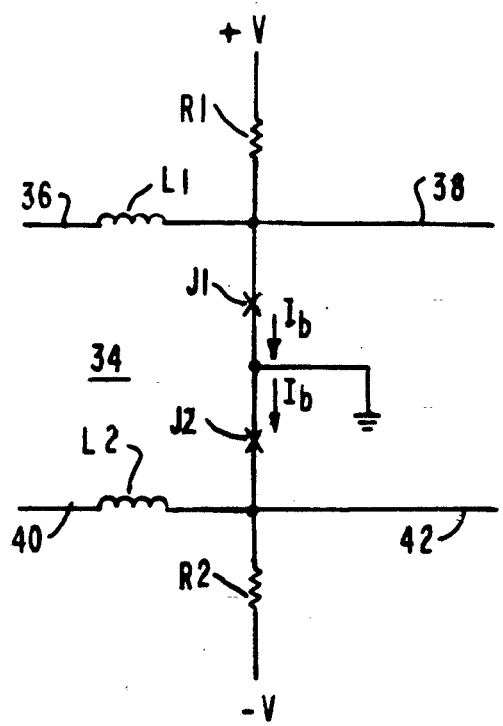
FIG. 2 is a repeater.

FIG. 2 illustrates a positive and negative signal repeater 34. A voltage source, in combination with resistor R1, establishes a bias current $I_b$ at about 75% of the critical current of Josephson junction J1. In FIG. 2, a positive input signal on line 36 passes through inductor L1 and results in a positive output signal on line 38 after a time delay. A negative input signal on line 40 passes through inductor L2 and results in a negative output signal on line 42 after a time delay. Time delays are used in PPFQ logic circuits to synchronize parallel signal processing.

Figure 3:
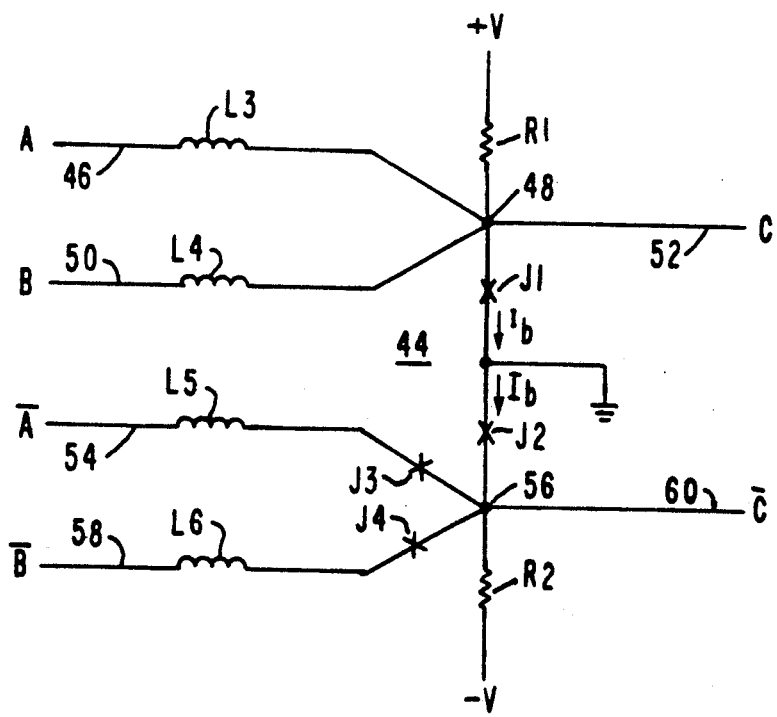
FIG. 3 is a conjunction.

FIG. 3 is a schematic diagram of a positive signal conjunction or hard-wired AND 44. Here again, the positive and negative voltage sources in combination with resistors R1 and R2 provide bias currents to junctions J1 and J2. A string of positive voltage signals on line 46 is connected via inductor L3 to junction point 48. Similarly, a string of positive signals on line 50 is connected via inductor L4 to junction point 48. The output signal on line 52 then consists of the conjoined string of positive signals on lines 46 and 50. A string of negative voltage signals on line 54 is connected via inductor L5 and Josephson junction J3 to junction point 56. Similarly, a string of negative signals on line 58 is connected via inductor L6 and Josephson junction J4 to junction point 56. The output signal on line 60 then consists of the conjoined string of negative signals on lines 54 and 58. Junctions J3 and J4 serve to isolate the two input data streams from each other. Josephson junctions are placed in the input lines to control the joining of two signals. With junctions in the lines, positive-logic signals disjoin; without junctions, positive-logic signals conjoin; and vice versa for negative-logic signals.

Figure 4:
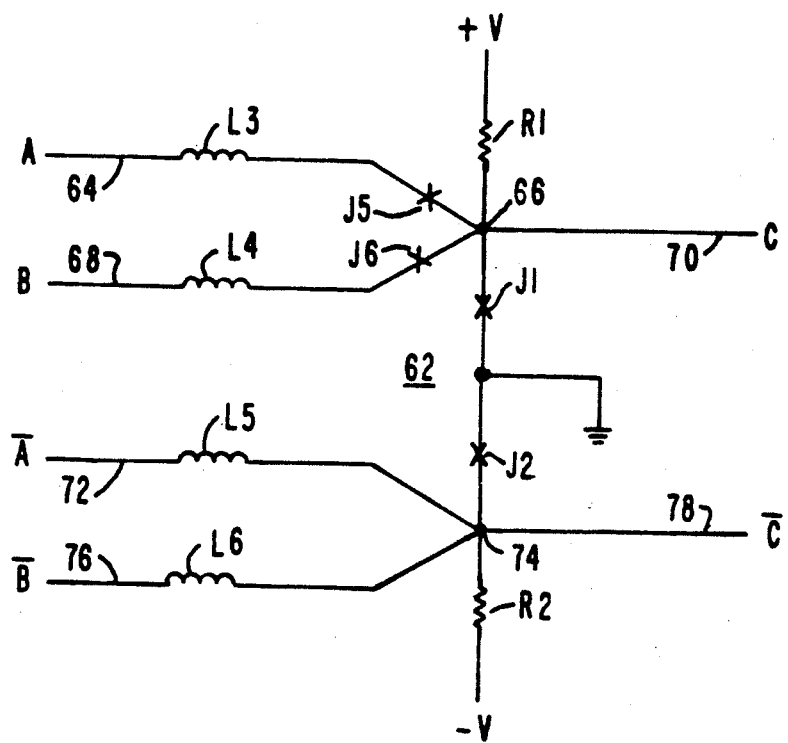
FIG. 4 is a disjunction.

FIG. 4 is a disjunction or hard-wired OR 62. Here again, the voltage sources in combination with resistors R1 and R2 set bias currents through junctions J1 and J2. In FIG. 4, a string of positive signals on line 64 is connected to junction point 66 through inductor L3 and Josephson junction J5, and a string of positive signals on line 68 is connected to junction point 66 through inductor L4 and Josephson junction J6. The positive pulses on line 64 and 68 are disjoined with each other to produce an OR output signal on line 70. A string of negative signals on line 72 is connected to junction point 74 through inductor L5, and a string of negative signals on line 76 is connected to junction point 74 through inductor L6. The negative pulses on line 72 and 76 are disjoined with each other to produce an OR output signal on line 78. Junctions J5 and J6 serve to isolate the two input data streams from each other. The conjunction circuit of FIG. 2 and the disjunction circuit of FIG. 3 are similar circuits wherein the voltage sources are reversed and the positive-logic signals are exchanged for negative-logic signals.

This invention allows logic or arithmetic operations to be individually performed on the two single polarity pulse signals. Since these signals pass through the circuits in parallel, they must be synchronized periodically.

Figure 5:
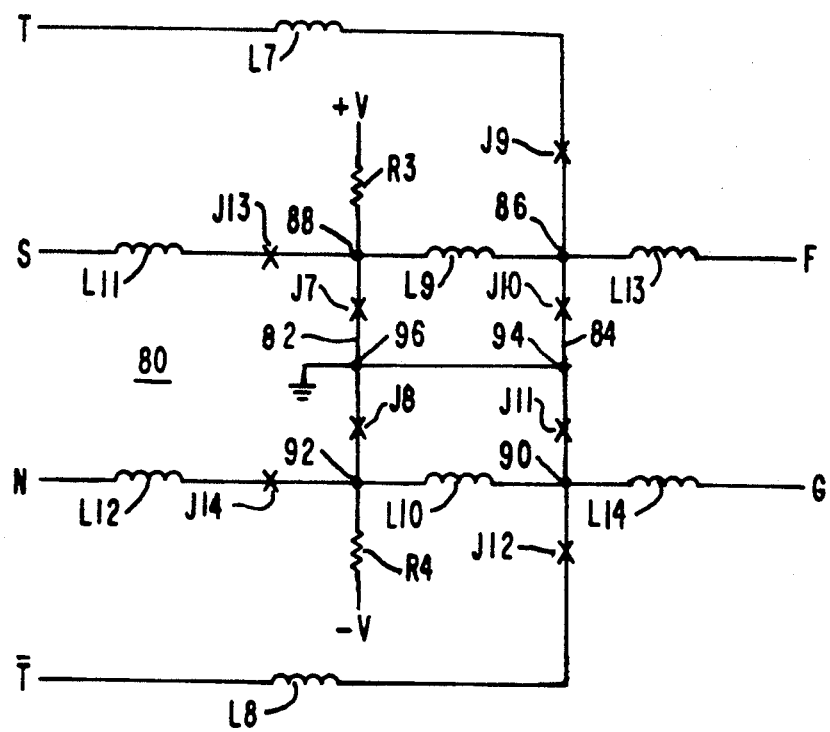
FIG. 5 is a synchronizing circuit.

FIG. 5 is a synchronizing circuit 80 which may be used to synchronize the positive and negative polarity data signals used in the circuits of this invention. A first circuit branch 82, including the series connection of Josephson junctions J7 and J8, is connected between positive and negative power supplies as shown. Resistors R3 and R4 serve as means for connecting circuit branch 82 to positive and negative bias voltage sources respectively. A second circuit branch 84 includes the series connection of Josephson junctions J9, J10, J11 and J12. Inductors L7 and L8 serve as means for applying positive and negative synchronizing signals to opposite ends of circuit branch 84. A first junction point 86 in circuit branch 84 is connected to a first junction point 88 in circuit branch 82, by inductor L9. A second junction point 90 in circuit branch 84 is connected to a second junction point 92 in circuit branch 82, by inductor L10. A third junction point 94 in circuit branch 84 is connected to ground, as is a third junction point 96 in circuit branch 82. Timing signals T and $\overline{T}$ are supplied to opposite ends of circuit branch 84. A first polarized data signal S (positive-logic) is supplied to junction point 88 via the series connection of inductor L11 and Josephson junction J13. A second polarized data signal N (negative-logic) is supplied to junction point 92 via the series connection of inductor L12 and Josephson junction J14. Output signals F and G are obtained from junction points 86 and 90 via inductors L13 and L14.

The circuit in FIG. 5 includes two single flux quantum RS flip-flop circuits mirrored around a ground plane. One circuit is powered by a positive voltage power source and the other circuit is powered by a negative voltage power source. The signals S and N arrive asynchronously and are stored in the interferometers (L9, J7 and J10; and L10, J8 and J11) until the synchronous timing pulses (T and $\overline{T}$) read and reset the state of the interferometers. The result is that the output signals F and G are sent out synchronously to the remainder of the circuit.

Figure 6:
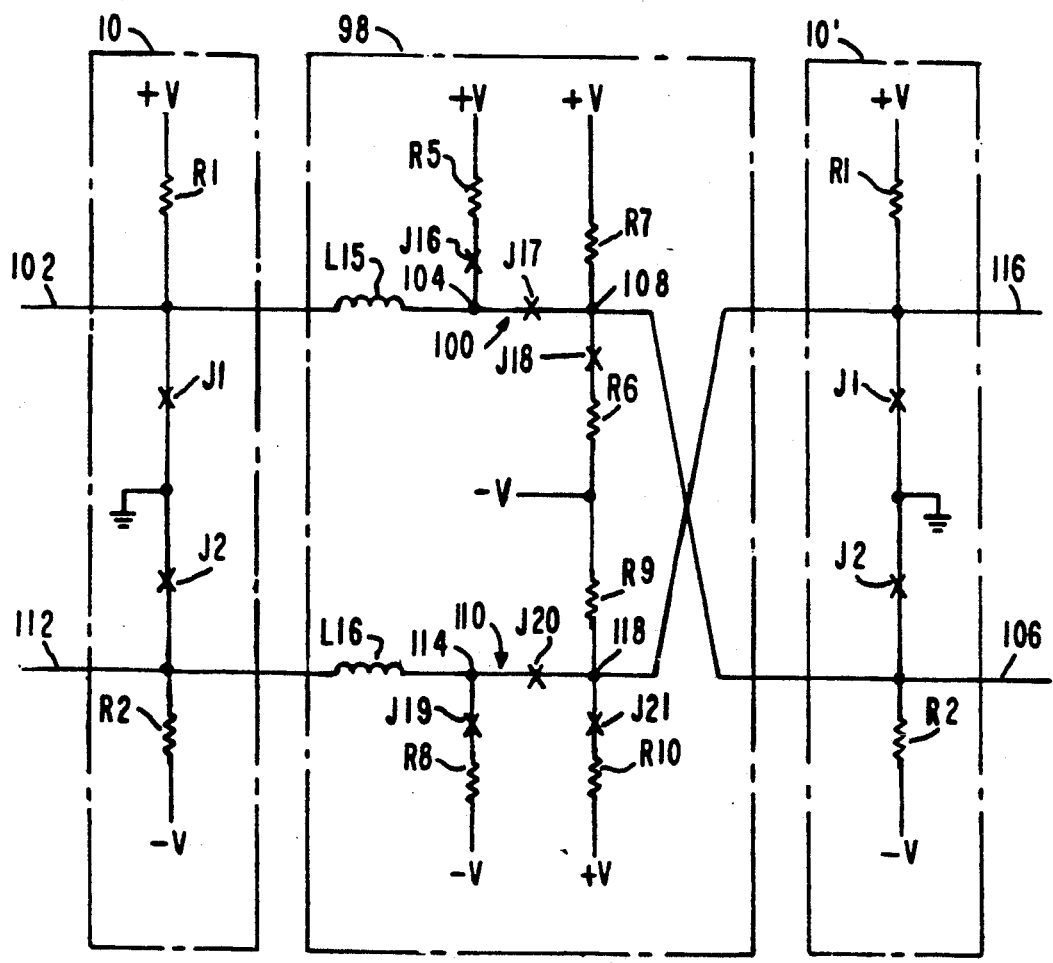
FIG. 6 is an inverter.

FIG. 6 is a schematic diagram of an inverter circuit 98 including a first circuit branch 100 having Josephson junctions J16, J17 and J18 electrically connected in series with each other. Resistor R5 serves as means for applying a positive bias voltage to a first end of circuit branch 100, and resistor R6 serves as means for applying a negative bias voltage to a second end of the circuit branch. An input positive rail 102 is connected through inductor L15 to a first node 104 in circuit branch 100. Output negative rail 106 is connected to a second node 108 in circuit branch 100. Resistor R7 serves as means for applyinq the positive bias voltage to node 108 in circuit branch 100.

A second circuit branch 110 including Josephson junctions J19 and J20 electrically connected in series with each other, is connected between resistor R8 and R9 which serve as means for applying the negative bias voltage to the ends of circuit branch 110. Input negative rail 112 applies a second input voltage signal to node 114 in circuit branch 110 through inductor L16. Output positive rail 116 extracts an output voltage signal from end 118 of circuit branch 110. A sixth Josephson junction J21 is electrically connected to end 118 of circuit branch 110. Resistor R10 serves as means for applying the positive bias voltage to one end of circuit branch 110 through the sixth Josephson junction J21.

In the circuit of FIG. 5, if the voltage on input line 102 does not change, then the voltage on output line 106 does not change. A positive pulse applied to line 102 will cause junction J1, in circuit 10, to normalize, thereby causing a reinforced voltage pulse to pass through inductor L15. The reinforced voltage pulse causes junction J17 to normalize, isolating the circuit to the left of junction J17 from the circuit to the right of junction J17. This isolation causes a negative voltage pulse to be drawn from point 108. This negative voltage pulse causes junction J2, in circuit 10', to normalize, providing a reinforced negative voltage pulse on output line 106. In a similar manner, voltage pulses on line 112 result in inverted voltage pulses on line 116.

The PPFQ circuits of this invention can be readily implemented using high temperature (near 77° K.) superconductors when these materials become available because of the use of non-hysteretic (shunted or crudely manufactured) Josephson tunnel junctions. Although the present invention has been described in terms of its preferred embodiments, it will be apparent to those skilled in the art that various changes may be made without departing from the scope of the invention. It is therefore intended that the appended claims cover such changes.

We claim:

1. A superconducting digital logic circuit comprising:
    a first circuit branch including first and second Josephson junctions electrically connected in series with each other;
    means for connecting a junction point between said first and second Josephson junctions to a neutral point;
    means for applying a positive bias voltage to a first end of said first circuit branch;
    means for applying a negative bias voltage to a second end of said first circuit branch;
    means for applying a first input voltage signal, having a first polarity, to said first end of said circuit branch;
    means for extracting a first output voltage signal from said first end of said circuit branch;
    means for applying a second input voltage signal, having a second polarity, to said second end of said circuit branch;
    means for extracting a second output voltage signal from said second end of said circuit branch;
    said means for applying a first input voltage signal to said first end of said first circuit branch comprising a first inductor; and
    said means for applying a second input voltage signal to said second end of said first circuit branch comprising a second inductor.

2. A superconducting digital logic circuit as recited in claim 1, wherein:
    said means for applying a positive bias voltage to said first end of said first circuit branch comprises a first resistor; and
    said means for applying a negative bias voltage to said second end of said first circuit branch comprises a second resistor.

3. A superconducting digital logic circuit comprising:
    a first circuit branch including first and second Josephson junctions electrically connected in series with each other;
    means for connecting a junction point between said first and second Josephson junctions to a neutral point;
    means for applying a positive bias voltage to a first end of said first circuit branch;
    means for applying a negative bias voltage to a second end of said first circuit branch;

4. A superconducting digital logic circuit as recited in claim 3, wherein:
    said means for applying a first input voltage signal to said first end of said first circuit branch comprises a first inductor;
    said means for applying a second input voltage signal to said second end of said first circuit branch comprises a second inductor;
    said means for applying a third input voltage signal to said first end of said first circuit branch comprises a third inductor; and
    said means for applying a fourth input voltage signal to said second end of said first circuit branch comprises a fourth inductor.

5. A superconducting digital logic circuit as recited in claim 4, wherein:
    said means for applying a first input voltage signal to said first end of said first circuit branch further comprises a third Josephson junction electrically connected in series with said first inductor; and
    said means for applying a third input voltage signal to said first end of said first circuit branch further comprises a fourth Josephson junction electrically connected in series with said third inductor.

6. A superconducting digital logic circuit as recited in claim 4, wherein:
said means for applying a second input voltage signal to said second end of said first circuit branch further comprises a third Josephson junction electrically connected in series with said second inductor; and
said means for applying a fourth input voltage signal to said second end of said first circuit branch further comprises a fourth Josephson junction electrically connected in series with said fourth inductor.

7. A superconducting digital logic circuit comprising:
a first circuit branch including first and second Josephson junctions electrically connected in series with each other;
a first inductor electrically connected in series with a third Josephson junction for applying a first input signal, having a first polarity, to a first end of said circuit branch;
a second inductor electrically connected in series with a fourth Josephson junction for applying a second input signal, having a second polarity, to a second end of said circuit branch;
means for applying a positive bias voltage to said first end of said first circuit branch;
means for applying a negative bias voltage to said second end of said first circuit branch;
a second circuit branch including fifth, sixth, seventh, and eighth Josephson junctions electrically connected in series with each other;
means for applying a positive synchronizing signal to a first end of said second circuit branch;
means for applying a negative synchronizing signal to a second and of said second circuit branch;
a third inductor electrically connected between said first end of said first circuit branch and a first junction point between said fifth and sixth Josephson junctions;
a fourth inductor electrically connected between said second end of said first circuit branch and a second junction point between said seventh and eighth Josephson junctions;
means for connecting a third junction point between said first and second Josephson junctions, and a fourth junction point between said sixth and seventh Josephson junctions to a neutral point;
means for extracting a first output voltage signal from said first junction point; and
means for extracting a second output voltage signal from said second junction point.

8. A superconducting digital logic circuit as recited in claim 7, wherein:
said means for applying a positive bias voltage to said first end of said first circuit branch comprises a first resistor; and
said means for applying a negative bias voltage to said second end of said first circuit branch comprises a second resistor.

9. A superconducting digital logic circuit as recited in claim 7, wherein:
said means for applying a positive synchronizing signal to a first end of said second circuit branch includes a fifth inductor; and
said means for applying a negative synchronizing signal to a second end of said second circuit branch includes a sixth inductor.

10. A superconducting digital logic circuit as recited in claim 9, wherein:
said means for extracting a first output voltage signal from said first junction point includes a seventh inductor; and
said means for extracting a second output voltage signal from said second junction point includes an eighth inductor.

11. A superconducting digital logic circuit comprising:
a first circuit branch including first, second, and third Josephson junctions electrically connected in series with each other;
means for applying a positive bias voltage to a first end of said first circuit branch;
means for applying a negative bias voltage to a second end of said first circuit branch;
means for applying a first input voltage signal, having a first polarity, to a first node in said first circuit branch;
means for extracting a first output voltage signal from a second node in said first circuit branch;
means for applying said positive bias voltage to said second node in said first circuit branch;
a second circuit branch including fourth and fifth Josephson junctions electrically connected in series with each other;
means for applying said negative bias voltage to a first end of said second circuit branch;
means for applying said negative bias voltage to a second end of said second circuit branch;
means for applying a second input voltage signal, having a second polarity, to a first node in said second circuit branch;
means for extracting a second output voltage signal from said second end of said second circuit branch;
a sixth Josephson junction electrically connected to said second end of said second circuit branch; and
means for applying said positive bias voltage to said sixth Josephson junction.

12. A superconducting digital logic circuit as recited in claim 11, wherein:
said means for applying said positive bias voltage to said first end of said first circuit branch comprises a first resistor;
said means for applying said negative bias voltage to said second end of said first circuit branch comprises a second resistor;
said means for applying said negative bias voltage to said first end of said second circuit branch comprises a third resistor; and
said means for applying said negative bias voltage to said second end of said second circuit branch comprises a fourth resistor.

13. A superconducting digital logic circuit as recited in claim 11, wherein:
said means for applying a first input voltage signal, having a first polarity, to said first node in said first circuit branch includes a first inductor; and
said means for applying a second input voltage signal, having a second polarity, to said first node in said second circuit branch includes a second inductor.

14. A method of performing digital logic in a superconducting circuit, said method comprising the steps of:
applying a positive bias voltage to a first end of a first circuit branch including first and second Josephson junctions electrically connected in series with each other;

applying a negative bias voltage to a second end of said first circuit branch;

connecting a junction point between said first and second Josephson junctions to a neutral point;

applying a first input voltage signal, having a first polarity, to said first end of said circuit branch;

extracting a first output voltage signal from said first end of said circuit branch;

applying a second input voltage signal, having a second polarity, to said second end of said circuit branch; and extracting a second output voltage signal from said second end of said circuit branch.

15. A method of performing digital logic in a superconducting circuit, as recited in claim 14, wherein:

said positive bias voltage is applied to said first end of said first circuit branch through a first resistor; and said negative bias voltage is applied to said second end of said first circuit branch through a second resistor.

16. A method of performing digital logic in a superconducting circuit, as recited in claim 14, wherein:

said a first input voltage signal is applied to said first end of said first circuit branch through a first inductor; and said second input voltage signal is applied to said second end of said first circuit branch through a second inductor.

17. A method of performing digital logic in a superconducting circuit, as recited in claim 14, further comprising the steps of:

applying a third input voltage signal, having said first polarity, to said first end of said first circuit branch; and applying a fourth input voltage signal, having said second polarity, to said second end of said first circuit branch.

18. A method of performing digital logic in a superconducting circuit, as recited in claim 17, wherein:

said first input voltage signal is applied to said first end of said first circuit branch through a first inductor;

said second input voltage signal is applied to said second end of said first circuit through a second inductor;

said third input voltage signal is applied to said first end of said first circuit branch through a third inductor; and said fourth input voltage signal is applied to said second end of said first circuit branch through a fourth inductor.

19. A method of performing digital logic in a superconducting circuit, as recited in claim 18, wherein:

said first input voltage signal is applied to said first end of said first circuit branch through a third Josephson junction electrically connected in series with said first inductor; and said third input voltage signal is applied to said first end of said first circuit branch through a fourth Josephson junction electrically connected in series with said third inductor.

20. A method of performing digital logic in a superconducting circuit, as recited in claim 18, wherein:

said second input voltage signal is applied to said second end of said first circuit through a third Josephson junction electrically connected in series with said second inductor; and said fourth input voltage signal is applied to said second end of said first circuit through a fourth Josephson junction electrically connected in series with said fourth inductor.

21. A method of synchronizing digital logic signals in a superconducting circuit, said method comprising the steps of:

applying a positive bias voltage to a first end of a first circuit branch including first and second Josephson junction electrically connected in series with each other;

applying a negative bias voltage to a second end of said first circuit branch;

applying a first input signal, having a first polarity, to said first end of said circuit branch through a first inductor electrically connected in series with a third Josephson junction for;

applying a second input signal, having a second polarity, to said second end of said circuit branch through a second inductor electrically connected in series with a fourth Josephson junction;

applying a positive synchronizing signal to a first end of said second circuit branch including fifth, sixth, seventh, and eighth Josephson junctions electrically connected in series with each other;

applying a negative synchronizing signal to a second end of said second circuit branch;

connecting a third inductor between said first end of said first circuit branch and a first junction point between said fifth and sixth Josephson junctions;

connecting a fourth inductor between said second end of said first circuit branch and a second junction point between said seventh and eighth Josephson junctions;

connecting a third junction point between said first and second Josephson junctions, and a fourth junction point between said sixth and seventh Josephson junctions to a neutral point;

extracting a first output voltage signal from said first junction point; and extracting a second output voltage signal from said second junction point.

22. A method of synchronizing digital logic signals in a superconducting circuit, as recited in claim 21, wherein:

said positive bias voltage is applied to said first end of said first circuit branch through a first resistor; and said negative bias voltage is applied to said second end of said first circuit branch comprises a second resistor.

23. A method of synchronizing digital logic signals in a superconducting circuit, as recited in claim 21, wherein:

said positive synchronizing signal is applied to said first end of said second circuit branch through a fifth inductor; and said negative synchronizing signal is applied to said second end of said second circuit branch through a sixth inductor.

24. A method of synchronizing digital logic signals in a superconducting circuit, as recited in claim 23, wherein:

said first output voltage signal is extracted from, said first junction point through a sixth inductor; and said second output voltage signal is extracted from said second junction point through a seventh inductor.

25. A method of performing digital logic in a superconducting circuit, said method comprising the steps of:
- applying a positive bias voltage to a first end of first circuit branch including first, second, and third Josephson junctions electrically connected in series with each other;
- applying a negative bias voltage to a second end of said first circuit branch;
- applying a first input voltage signal, having a first polarity, to a first node in said first circuit branch;
- extracting a first output voltage signal from a second node in said first circuit branch;
- applying said positive bias voltage to said second node in said first circuit branch;
- applying said negative bias voltage to a first end of said second circuit branch including fourth and fifth Josephson junctions electrically connected in series with each other;
- applying said negative bias voltage to a second end of said second circuit branch;
- applying a second input voltage signal, having a second polarity, to a first node in said second circuit branch;
- extracting a second output voltage signal from said second end of said second circuit branch; and
- applying said positive bias voltage to said second end of said second circuit branch through a sixth Josephson junction.

26. A method of performing digital logic in a superconducting circuit, as recited in claim 25, wherein:
- said positive bias voltage is applied to said first end of said first circuit branch through a first resistor;
- said negative bias voltage is applied to said second end of said first circuit branch through a second resistor;
- said negative bias voltage is applied to said first end of said second circuit branch through a third resistor; and
- said negative bias voltage is applied to said second end of said second circuit branch through a fourth resistor.

27. A method of performing digital logic in a superconducting circuit, as recited in claim 25, wherein:
- said first input voltage signal, having a first polarity, is applied to said first node in said first circuit branch through a first inductor; and
- said a second input voltage signal, having a second polarity, is applied to said first node in said second circuit branch through a second inductor.